United States Patent
Jang

(10) Patent No.: US 7,939,813 B2
(45) Date of Patent: May 10, 2011

(54) E-BEAM EXPOSURE APPARATUS

(75) Inventor: Dong S. Jang, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 168 days.

(21) Appl. No.: 12/323,692

(22) Filed: Nov. 26, 2008

(65) Prior Publication Data

US 2009/0166552 A1 Jul. 2, 2009

(30) Foreign Application Priority Data

Jan. 2, 2008 (KR) .................. 10-2008-0000383

(51) Int. Cl.
*H01J 37/00* (2006.01)
(52) U.S. Cl. ............. 250/492.22; 250/492.1; 250/492.2; 250/492.3; 250/306; 250/307
(58) Field of Classification Search ............... 250/492.1, 250/492.2, 492.22, 492.23, 492.3, 306, 307, 250/309, 310, 311
See application file for complete search history.

(56) References Cited

U.S. PATENT DOCUMENTS

| | | | |
|---|---|---|---|
| 6,172,364 B1 * | 1/2001 | Ogasawara et al. | 250/310 |
| 6,326,635 B1 * | 12/2001 | Innes et al. | 250/505.1 |
| 7,514,682 B2 * | 4/2009 | Buller et al. | 250/310 |
| 7,598,499 B2 * | 10/2009 | Platzgummer | 250/398 |
| 2001/0016295 A1 | 8/2001 | Choi et al. | |
| 2007/0145269 A1 * | 6/2007 | Buller et al. | 250/310 |

FOREIGN PATENT DOCUMENTS

KR 10-2004-0002192 7/2004

* cited by examiner

*Primary Examiner* — Robert Kim
*Assistant Examiner* — Michael Maskell
(74) *Attorney, Agent, or Firm* — Marshall, Gerstein & Borun LLP

(57) ABSTRACT

An e-beam exposure apparatus includes an electron gun provide an e-beam for exposure to a resist layer formed on a substrate; an e-beam column part inducing the path of the e-beam generated from the electron gun; and an electron collecting part disposed at the periphery of the path of the e-beam projected from the e-beam column part on the resist layer to absorb scattered electrons resulting from emission of the incident e-beam from the resist layer.

3 Claims, 2 Drawing Sheets

E-BEAM EXPOSURE APPARATUS

CROSS-REFERENCE TO RELATED APPLICATIONS

The present application claims priority to Korean patent application number 10-2008-0000383, filed on Jan. 2, 2008, which is incorporated by reference in its entirety.

BACKGROUND OF THE INVENTION

The present invention relates to manufacture of a semiconductor device, and more particularly, to an electron beam (e-beam) exposure apparatus for irradiating an e-beam to a resist to draw patterns.

A lithography process is carried out to realize a semiconductor device on a wafer. In the lithography process, a layout of circuit patterns for forming a semiconductor device is first designed and a process for fabricating a photomask is then carried out by forming a mask pattern according to the designed pattern layout onto a transparent quartz substrate. After that, an exposure process using the photomask is carried out on a photoresist layer on a wafer with an exposure apparatus, thereby realizing a photoresist pattern according to the designed layout on the wafer. By carrying out a selective etch process using this photoresist pattern, a circuit pattern is actually formed on the wafer.

In order to pattern transfer the designed pattern layout onto the mask pattern during the process of fabricating the photomask, a resist drawing or exposure process using an e-beam exposure apparatus is carried out. For example, a chrome (Cr) layer or a molybdenum (Mo) alloy layer is formed as a mask layer on the transparent quartz substrate, a resist layer is coated on the mask layer and e-beam is then scanned using the e-beam exposure apparatus, thereby carrying out a selective exposure on the resist layer.

A resist pattern is formed by developing the e-beam exposed resist layer and the mask pattern is formed by carrying out a selective etch process using the resist pattern. Therefore, uniformity of a Critical Dimension (CD) of the mask pattern depends on the uniformity of the CD of the resist pattern used as an etch mask. The uniformity of the CD of the resist pattern largely depends on an exposure accuracy upon actual e-beam exposure or an exposure precision of the e-beam exposure apparatus.

As one of factors that influence on the uniformity of the CD of the resist pattern, a fogging effect by electron scattering below an e-beam column part having a magnetic lens and beam slots may be considered. e-beam incident to the surface of the resist layer may result in electrons rebounding from the surface, for example, forward scattered electrons.

Since the e-beam irradiated from the e-beam exposure apparatus is in an accelerated state with a constant acceleration voltage, relatively many electrons rebound from the surface of the resist layer into a region of high open ratio, i.e. a portion having a large area to be actually exposed. These electrons are scattered on the resist layer and may enter into the resist layer. Therefore, the area to be exposed in the resist layer may not be precisely removed and this may result in an enlarged pattern size that is over CD.

When this fogging effect results, the uniformity of the CD of the resist pattern is lowered, and accordingly, the uniformity of the CD of the mask pattern etched according to the CD of the resist pattern may also be lowered. This lowering in the uniformity of the CD of the mask pattern consequently results in lowering in uniformity of the CD of the wafer pattern formed by pattern transfer of the mask pattern onto the wafer. A solution that can reduce or inhibit the fogging effect during the e-beam exposure is beneficial.

SUMMARY OF THE INVENTION

In one embodiment, an e-beam exposure apparatus may include: an electron gun for providing an e-beam for exposure to a resist layer formed on a substrate; an e-beam column part inducing the e-beam generated from the electron gun to be incident to the resist layer; and an electron collecting part introduced at the periphery of the path of the e-beam projected from the e-beam column part on the resist layer to absorb scattered electrons resulted from emission of the incident e-beam from a surface of the resist layer and thus inhibit the scattered electrons from being incident again into the resist layer.

The electron collecting part may include a plate body having an opposing surface that opposes the surface of the resist layer; electron inducing holes formed in plural on the opposing surface, into which the scattered electrons enter; and an absorbing tunnel connected to the electron inducing holes to induce the scattered electrons to further enter into an inside of the plate body so that kinetic energy of the scattered electrons entering into the hole is consumed, thereby absorbing the electrons.

The plate body is introduced with the opposing surface being inclined to have a given angle with respect to the surface of the resist layer so that the scattered electrons enter into the holes.

Embodiments according to the present invention may provide an e-beam exposure apparatus that can inhibit a fogging effect due to scattered electrons and improve uniformity of CD of a mask pattern upon fabrication of a photomask by eliminating reflected and scattered electrons.

DESCRIPTION OF SPECIFIC EMBODIMENTS

Embodiments of the present invention are directed to an e-beam exposure apparatus that can inhibit a fogging effect due to scattered electrons and improve uniformity of CD of a mask pattern upon fabrication of a photomask by eliminating reflected and scattered electrons.

In embodiments of the present invention, an electron collecting part for collecting scattered electrons generated by an e-beam incident to a resist layer on a transparent substrate with a constant acceleration voltage, i.e. forward scattered electrons that rebound from the surface of the resist layer is introduced at the periphery of an incident path of the e-beam. An incidence of the e-beam including accelerated electrons in a region having relatively large area to be irradiated with the e-beam results in rebounding and scattering of electrons from the surface of the resist layer. These scattered electrons enlarge the size of a resist pattern to more than the designed size, which results in an over CD. In embodiments of the present invention, the electron collecting part is introduced on the resist layer and the electron collecting part is placed on the e-beam path to collect the scattered electrons so that the scattered electrons do not reenter into the inside of the resist layer.

The electron collecting part may be placed at the lowermost of an e-beam column part for irradiating the e-beam, e.g., below an objective lens. The electron collecting part may be formed in a shape of a plate capable of absorbing the rebound electrons so that kinetic energy of the electrons is consumed while changing the direction of the electrons reducing or eliminating unnecessary forward scattered electrons. The electron collecting part may have a plate shaped body that is opposite to the surface of the resist layer on the substrate and a plurality of holes is provided in the opposing surface of the body to induce the scattered electrons to enter into the holes. The scattered electrons entering into the hole are scattered in an absorbing tunnel connected to the hole or an inner wall of the hole to consume their kinetic energy, and the electrons which have consumed their kinetic energy are eliminated in the inside of the electron collecting part. This electron collecting part may be maintained in a grounded state to inhibit an electric charge by the collected electrons.

Figure 1:
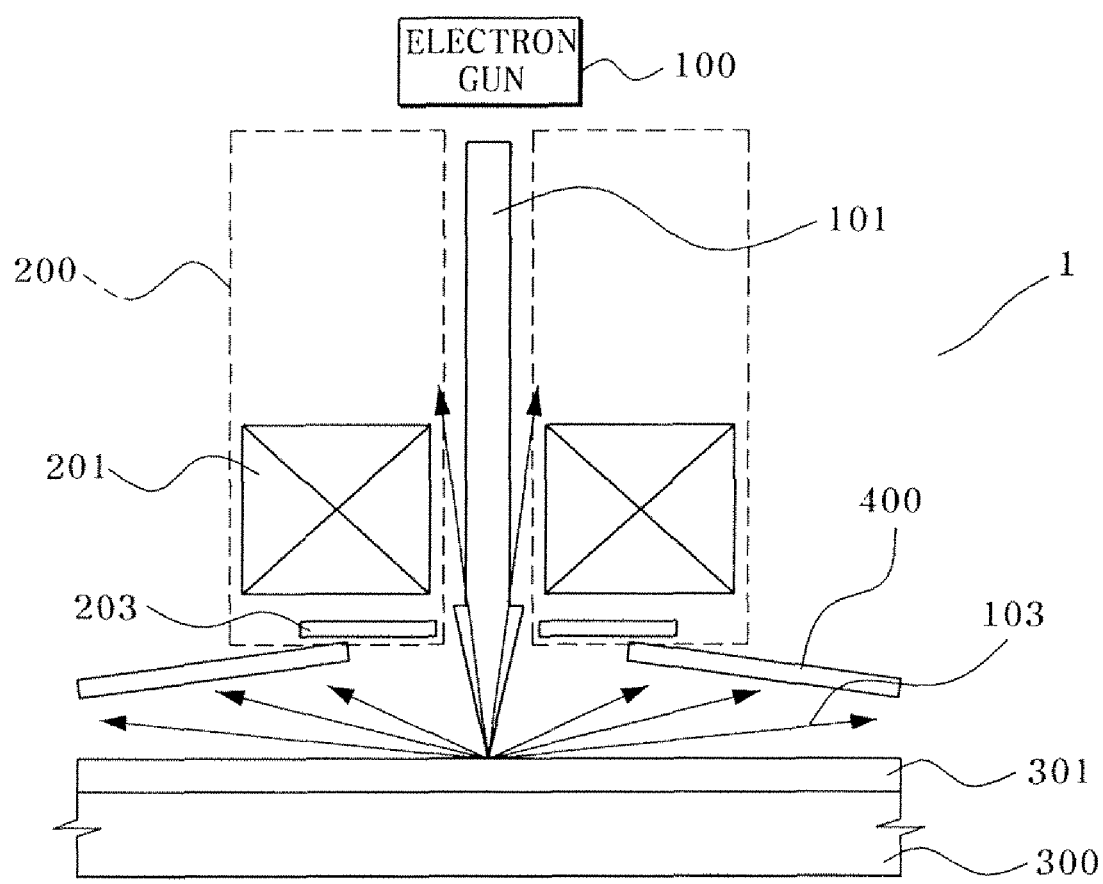
FIG. 1 is a schematic view illustrating an e-beam exposure apparatus according to an embodiment of the present invention.
Figure 2:
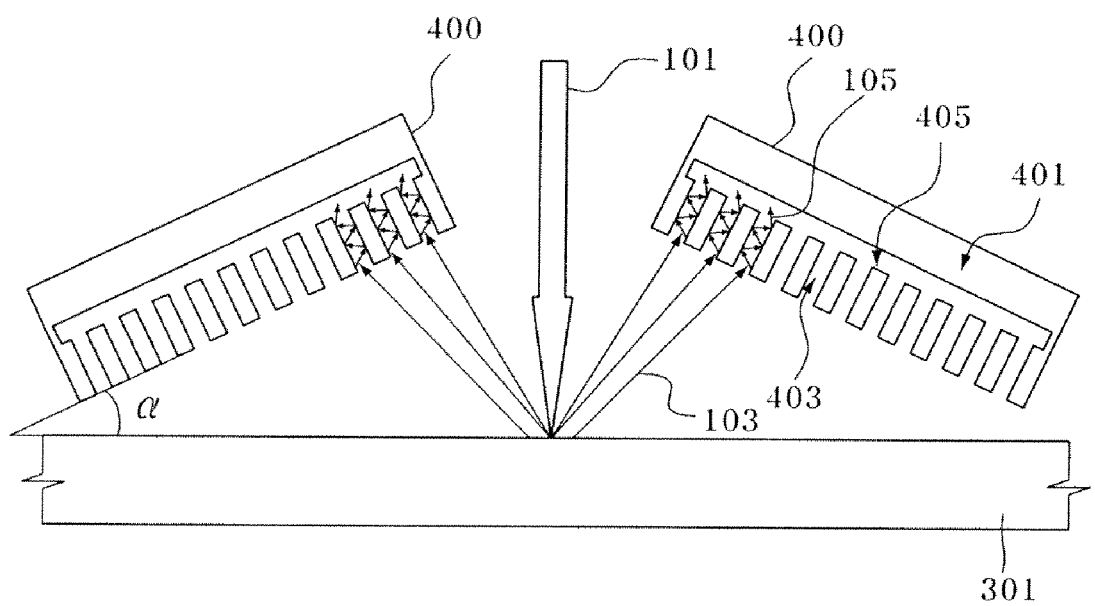
FIG. 2 is a schematic view illustrating an electron collecting part of the e-beam exposure apparatus according to an embodiment of the present invention.

FIGS. 1 and 2 are schematic views illustrating an e-beam exposure apparatus according to an embodiment of the present invention.

Referring to FIG. 1, an e-beam exposure apparatus according to an embodiment of the present invention includes an electron gun 100 for irradiating an e-beam 101 and an e-beam column part 200 having magnetic lenses (not depicted) for controlling a size, a path and an acceleration of the generated e-beam 101. The e-beam column part 200 is provided with a plurality of the lenses and a beam slot to adjust and control the size and path of the e-beam. The e-beam 101 projected along an objective lens 201 and a projection beam slot 203 therebelow is incident onto a substrate 300 mounted on a mask stage below the electron beam column part 200.

The e-beam 101 is incident onto a resist layer 301 formed on the transparent substrate 300 and to be e-beam exposed, and electrons of the incident e-beam 101 are transferred to the inside of the resist layer 301 to expose the resist. At this time, since the e-beam 101 is incident to the surface of the resist layer 301 in the state of being accelerated by an acceleration voltage, some electrons are reflected and scattered on the surface and emitted to the outside. These forward scattered electrons 103 may be scattered again by collision with a body of the beam slot 203 placed on the resist layer 301 or the like and may therefore be incident again to the inside of the resist layer 301, thereby inducing a phenomenon in that the CD of the resist is excessively enlarged, i.e. a fogging effect.

In order to inhibit the fogging effect due to these scattered electrons 103, an electron collecting part 400 for collecting the scattered electrons 103 to prevent the scattered electrons 103 from reentering into the inside of the resist layer 301 is introduced relative to the resist layer 301. The electron collecting part 400 may be disposed at the periphery of the path of the e-beam 101 projected from the e-beam column part 200. That is to say the electron collecting part 400 is introduced at a place, below the electron column part 200, spaced apart from the substrate 300 by a predetermined distance. The position of the electron collecting part 400 may be made adjustable so that the electron collecting part 400 may be placed toward a direction along which the scattered electrons run.

In order to collect the scattered electrons 103, in the embodiment of the invention as shown in FIG. 2, the electron collecting part 400 may include a plate body 401 having a surface which opposes to the surface of the resist layer 301. The opposing surface of the plate body 401 may be formed with a plurality of electron inducing holes 403 slantingly opened so that the scattered electrons enter therein. The electron inducing holes 403 are connected to an absorbing tunnel 405 for absorbing the electrons. The scattered electrons 105 enter into the inside of the electron inducing hole 403 collide with the inner wall of the electron inducing hole 403 to consume their kinetic energy, and enter into the absorbing tunnel 405 through this process.

Since the absorbing tunnel 405 extends with a predetermined angle, for example, a right angle, with respect to the extension direction of the electron inducing hole 403, the scattered electrons 105 arrived at the absorbing tunnel 105 lose their kinetic energy by the process of repeatedly colliding with the wall of the tunnel 405. Therefore, the scattered electrons 105 which have consumed their kinetic energy are eliminated by being absorbed into the inner wall of the tunnel 405. In order to inhibit that the plate body 401 is charged by absorption of the scattered electrons 105, the plate body 401 may be grounded. On the other hand, in order to induce the scattered electrons 105 scattered and emitted from the surface of the resist layer 301 to more readily enter into the holes 403, the plate body 401 may be introduced with the opposing surface thereof being slantingly inclined to have a predetermined angle $\alpha$ with respect to the surface of the resist layer 301 so that an entrance of the hole 403 faces the direction generally corresponding to the running direction of the scattered electrons 103.

As is apparent from the above description, in embodiments of the present invention, in order to inhibit the scattered electrons 103 emitted and scattered from the surface of the resist layer 301 from being scattered and absorbed again into the resist layer 301, the electron collecting part 400 for absorbing and eliminating the scattered electrons 103 is introduced relative to the resist layer 301. Therefore, since it is possible to inhibit the scattered electrons from being re-absorbed into the inside of the resist layer 301, it is possible to induce the exposure range to be more precisely controlled. In other words, it is possible to ensure the uniformity of the CD of the resist pattern and inhibit the fogging effect. Therefore, it is possible to fabricate a photomask with improved uniformity of the CD of the mask pattern.

While the present invention has been described with respect to the specific embodiments, it will be apparent to those skilled in the art that various changes and modifications may be made without departing from the spirit and scope of the invention as defined in the following claims.

What is claimed is:

1. An e-beam exposure apparatus, comprising:
an electron gun providing an e-beam for exposure to a resist layer formed on a substrate;
an e-beam column part inducing the e-beam to be incident to the resist layer; and
an electron collecting part introduced at the periphery of a path of the e-beam to absorb electrons scattered from a surface of the resist layer and thus inhibit the scattered electrons from being incident again onto the resist layer;
wherein the electron collecting part includes:
a plate body having a surface that opposes the surface of the resist layer;
a plurality of electron inducing holes formed in the opposing surface, into which the scattered electrons enter; and
an absorbing tunnel formed in the inside of the plate body so that the absorbing tunnel is perpendicularly connected to the electron inducing holes and the scattered electrons entering into the electron inducing holes collide with a wall of the absorbing tunnel to consume the kinetic energy.

2. The e-beam exposure apparatus of claim 1, wherein the plate body is disposed with the surface being inclined with respect to the surface of the resist layer so that the scattered electrons enter into the holes.

3. The e-beam exposure apparatus of claim 1, wherein the plate body is grounded.

* * * * *